(12) United States Patent
Kato

(10) Patent No.: US 8,785,785 B2
(45) Date of Patent: Jul. 22, 2014

(54) CERAMIC CIRCUIT BOARD AND PROCESS FOR PRODUCING SAME

(75) Inventor: Hiromasa Kato, Nagareyama (JP)

(73) Assignees: Kabushiki Kaisha Toshiba (JP); Toshiba Materials Co., Ltd. (JP)

( * ) Notice: Subject to any disclaimer, the term of this patent is extended or adjusted under 35 U.S.C. 154(b) by 53 days.

(21) Appl. No.: 13/418,813

(22) Filed: Mar. 13, 2012

(65) Prior Publication Data

US 2012/0168209 A1 Jul. 5, 2012

Related U.S. Application Data

(63) Continuation of application No. PCT/JP2010/065914, filed on Sep. 15, 2010.

(30) Foreign Application Priority Data

Sep. 15, 2009 (JP) ................................. 2009-213511

(51) Int. Cl.
*H05K 1/03* (2006.01)

(52) U.S. Cl.
USPC ............ 174/256; 174/255; 174/257; 361/767

(58) Field of Classification Search
USPC .......... 174/256, 257, 250, 255, 261; 361/767, 361/771
See application file for complete search history.

(56) References Cited

U.S. PATENT DOCUMENTS

| | | | | |
|---|---|---|---|---|
| 6,440,590 | B1* | 8/2002 | Nomura et al. | 428/698 |
| 7,031,166 | B2* | 4/2006 | Imamura et al. | 361/750 |
| 2002/0060091 | A1* | 5/2002 | Naba et al. | 174/257 |

FOREIGN PATENT DOCUMENTS

| | | | |
|---|---|---|---|
| JP | 10-190176 | | 7/1998 |
| JP | 11-340598 | | 12/1999 |
| JP | 11340598 | A * | 12/1999 |
| JP | 2007-173577 | | 7/2007 |
| JP | 2007173577 | A * | 7/2007 |

OTHER PUBLICATIONS

English Translation of International Preliminary Report on Patentability for PCT/JP2010/065914 (Apr. 11, 2012).

* cited by examiner

*Primary Examiner* — Hoa C Nguyen
*Assistant Examiner* — Amol Patel
(74) *Attorney, Agent, or Firm* — Harness, Dickey & Pierce, P.L.C.

(57) ABSTRACT

According to one embodiment, a ceramic circuit board includes a ceramic substrate, a copper circuit plate and a brazing material protrudent part. The copper circuit plate is bonded to at least one surface of the ceramic substrate through a brazing material layer including Ag, Cu, and Ti. The brazing material protrudent part includes a Ti phase and a TiN phase by 3% by mass or more in total, which is different from the total amount of a Ti phase and a TiN phase in the brazing material layer that is interposed between the ceramic substrate and the copper circuit plate. The number of voids each having an area of 200 $\mu m^2$ or less in the brazing material protrudent part is one or less (including zero).

20 Claims, 3 Drawing Sheets

_US 8,785,785 B2_

CERAMIC CIRCUIT BOARD AND PROCESS FOR PRODUCING SAME

CROSS-REFERENCE TO RELATED APPLICATIONS

This application is a Continuation Application of PCT Application No. PCT/JP2010/065914, filed Sep. 15, 2010 and based upon and claiming the benefit of priority from prior Japanese Patent Application No. 2009-213511, filed Sep. 15, 2009, the entire contents of all of which are incorporated herein by reference.

FIELD

Embodiments described herein relate generally to a ceramic circuit board and a method for the production of the same, and is specifically preferable for a power module and the like that require high reliability.

BACKGROUND

In recent years, power modules are used so as to control a large current and a large voltage in electrical vehicles and electrical trains from the viewpoints of improvement of performances of industrial devices and problems of the global environment. The heat produced by semiconductor devices that are mounted on them has been increasing steadily. Therefore, a heat releasing property is important in circuit boards for power modules. Ceramic-metal bonded circuit boards using a high-thermal-conduction ceramic substrate bonded to a metal plate of copper, aluminum or the like are widely used.

For high-thermal-conduction ceramic substrates, substrates of silicon nitride or aluminum nitride having a high thermal conduction property and high electrical insulation property are used. A ceramic-metal circuit boards including the high-thermal-conduction ceramic substrate bonded to a metal plate with an active brazing metal comprising Ag—Cu are widely used. As the metal plate, copper, which is superior to aluminum in electrical conductivity and thermal conduction property, is generally used. Since copper has a higher yield stress than does aluminum and differs greatly from ceramic in thermal expansion, there is a problem that the thermal cycle resistance and thermal shock resistance of the ceramic-metal circuit board are decreased and cracks are easily produced in the ceramic substrate as the thickness of the copper plate increases, which leads to a decrease in reliability.

The above-mentioned problems were reported in Patent Literatures 1, 2 and the like. In Patent Literatures 1 and 2, reliability is improved by relaxing stress concentration at the end surface portion of a copper circuit plate in the ceramic substrate by making a brazing material layer protrude outward from the copper circuit plate.

In a ceramic-metal circuit board, a predetermined circuit pattern is formed on a copper circuit plate so as to mount and connect a semiconductor device. High-definition is required for the position and form of the circuit pattern, and in order to obtain a high-definition pattern, a method comprising bonding a copper plate to a ceramic substrate and thereafter forming a circuit pattern by an etching process is generally used.

CITATION LIST

Patent Literatures

Patent Literature 1: Jpn. Pat. Appln. KOKAI Publication No. 10-190176

Patent Literature 2: Jpn. Pat. Appln. KOKAI Publication No. 11-340598

DETAILED DESCRIPTION

Figure 1:
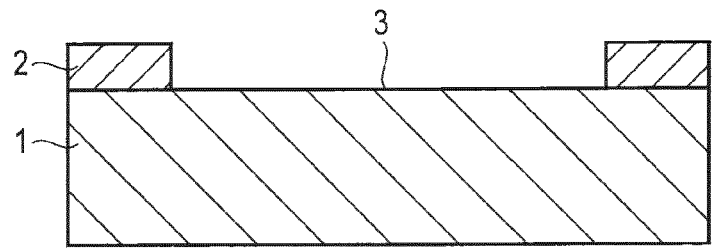
FIG. 1 is a cross-sectional view that schematically shows a first masking step in a second embodiment.

In general, according to one embodiment, a ceramic circuit board including a ceramic substrate, a copper circuit plate and a brazing material protrudent part is provided. The copper circuit plate is bonded to at least one surface of the ceramic substrate through a brazing material layer including Ag, Cu, and Ti. The brazing material protrudent part is formed by the brazing material layer which protrudes outward from a side surface of the copper circuit plate. The brazing material protrudent part includes a Ti phase and a TiN phase by 3% by mass or more in total, which is different from the total amount of a Ti phase and a TiN phase in the brazing material layer that is interposed between the ceramic substrate and the copper circuit plate. The number of voids each having an area of 200 $\mu m^2$ or less in the brazing material protrudent part is one or less (including zero).

According to one embodiment, a method for the production of a ceramic circuit board is provided. The method includes:

providing a first masking on a part other than an area to be a copper circuit pattern and a brazing material protrudent part on a ceramic substrate;

forming a brazing material layer comprising Ag, Cu and Ti on an area other than the first masking on the ceramic substrate;

mounting a copper plate on the brazing material layer and bonding the ceramic substrate and the copper plate by heating;

providing a second masking on an area to be a copper circuit pattern on the copper plate; and forming a copper circuit pattern by etching.

The present inventors have ascertained that, when a brazing material layer that protrudes outward from the copper circuit plate is provided, there is a problem that voids are produced in the brazing material layer that protrudes from the copper circuit plate. The voids are produced in the case when the protrudent part and a circuit pattern are formed by an etching process. Therefore, uniform dispersion of thermal stress that is to be relaxation of the stress concentration at the end portion of the copper circuit plate, which can be expected by protruding the brazing material layer, is not caused, and cracking of the ceramic substrate easily occurs.

The embodiment was made in view of such technical problems, and aims at providing a ceramic circuit board that has a brazing material protrudent part having fewer defects due to voids or the like, and has improved thermal cycle resistance, and a method for the production of the same.

According to the embodiment, a ceramic circuit board that has a brazing material protrudent part having fewer defects due to voids or the like and has improved thermal cycle resistance, and a method for the production of the same can be provided.

First Embodiment

The ceramic circuit board of the first embodiment comprises a ceramic substrate, a copper circuit plate that is bonded to at least one surface of the ceramic substrate through a brazing material layer, and a brazing material protrudent part that is formed by the brazing material layer and protrudes outward from the side surface of the copper circuit plate. The brazing material layer is formed from a brazing material comprising Ag, Cu and Ti. The present inventors have discovered that a ceramic-metal circuit board having high reliability can be realized by adjusting the brazing material protrudent part to comprise a Ti phase and a TiN phase by 3% by mass or more in total, and adjusting the total amount thereof to be different from the total amount of a Ti phase and a TiN phase in the brazing material layer that is interposed between the copper circuit plate and the ceramic substrate (hereinafter referred to as a bonding layer), and further adjusting the number of voids each having an area of 200 $\mu m^2$ or less in the brazing material protrudent part to one or less (including zero), since the thermal stress due to the difference in thermal expansion between the copper circuit plate and an electronic part is relaxed and bonding defects are decreased extremely.

Here, the interface between the bonding layer and the ceramic substrate or copper circuit plate is determined by the distribution of Ag, and the interface is defined by using a part in which Ag is present as a bonding layer. Furthermore, the number of voids each having an area of 200 $\mu m^2$ or less can be obtained by measuring the voids in a cross-sectional surface having an area of 200 $\mu m^2$ in the brazing material protrudent part.

It is desirable that the total of the Ti phase and TiN phase in the brazing material protrudent part is more than the total of the Ti phase and TiN phase in the bonding layer. This can further increase an effect of relaxing thermal stress.

It is more preferable that the brazing material protrudent part comprises the Ti phase and TiN phase by 3% by mass to 40% by mass in total. When the total of the Ti phase and TiN phase exceeds 40% by mass, the amount of the Ti phase and TiN phase becomes too much, thereby the brazing material protrudent part becomes hard and may lead to decrease in thermal cycle characteristics (TCT characteristics).

The total amount of the Ti phase and TiN phase in the brazing material layer can be measured by, for example, an electron probe microanalysis (EPMA) or an energy dispersive X-ray analysis (EDX).

It is preferable that the brazing material layer is formed by using a brazing material having a composition consisting of Ag: 90 to 50% by weight, an element consisting of Sn and/or In: 5 to 15% by weight, Ti: 0.1 to 6% by weight, a remnant Cu and unavoidable impurities. When the composition is such composition, a sufficient effect can be obtained. It is preferable that the content of Ti is from 2 to 5% by weight. The above-mentioned composition is the composition of the brazing material before application and printing on the ceramic substrate, and the composition of the bonding layer after bonding varies depending on a step of binding an active metal (heat treatment) that is conducted after the steps of application and printing, and the like.

It is preferable that the brazing material protrudent part has a protrudent length that is 0.01 mm or more and is 30% or less of a space in the copper circuit plate. By adjusting the protrudent length to 0.01 mm or more, the effect of relaxing stress concentration by the brazing material protrudent part can be obtained sufficiently. By adjusting the protrudent length to 30% or less of the space in the copper circuit plate, the electrical insulation property between copper circuit plates can be ensured, and formation of fine patterns can be accommodated. A more preferable range of the protrudent length is from 0.01 to 20% of the space in the copper circuit plate.

The ceramic substrate can be formed from, for example, silicon nitride ($Si_3N_4$), aluminum nitride (AlN) or alumina ($Al_2O_3$). A silicon nitride substrate is preferred since a ceramic circuit board that is excellent in both thermal cycle resistance and thermal shock resistance can be obtained.

Particularly, a silicon nitride ($Si_3N_4$) substrate having a thermal conduction rate of 80 W/m·K or more and a three-point bending strength of 600 MPa or more is preferred. Furthermore, an aluminum nitride (AlN) substrate having a thermal conduction rate of 150 W/m·K or more and a three-point bending strength of 400 MPa or more is preferred. Furthermore, an alumina ($Al_2O_3$) substrate having a thermal conduction rate of 20 W/m·K or more and a three-point bending strength of 400 MPa or more is preferred.

The copper circuit plate is formed from copper or a copper alloy. The copper circuit plate preferably has a thickness of 0.25 mm or more. This is because the thicker the copper circuit plate is, the greater the stresses produced in the ceramic substrate and the end portion of the copper circuit plate are, and thus stress relaxation by the brazing material protrudent part is required. More preferably, the copper circuit plate has a thickness of from 0.25 mm to 0.8 mm. When the thickness of the copper circuit plate exceeds 0.8 mm, the stress produced between an electronic part that is mounted on the copper circuit plate by soldering and the copper circuit plate increases, and the effect by the brazing material protrudent part may not be obtained sufficiently.

In order to obtain a sufficient effect of improving thermal cycle resistance, it is desirable that the ceramic substrate is formed from silicon nitride, aluminum nitride or alumina and the thickness of the copper circuit plate is adjusted to 0.25 mm or more.

Second Embodiment

As a method for the production of a ceramic circuit board of the first embodiment, a method for the production of a second embodiment is shown as an example.

The method of the second embodiment comprises: a step of providing a first masking on a part other than an area to be a copper circuit pattern and a brazing material protrudent part on a ceramic substrate; a step of forming a brazing material layer by applying or printing a brazing material comprising Ag, Cu and Ti to the area on which the first masking has not been provided; a step of mounting a copper plate on the brazing material layer and bonding the ceramic substrate and the copper plate by heating; a step of providing a second masking on an area to be a copper circuit pattern of the copper plate; and a step of forming a copper circuit pattern by etching.

Hereinafter the production method will be explained with referring to FIGS. 1 to 6.

As shown in FIG. 1, a first masking 2 is provided on a ceramic substrate 1. The first masking 2 is formed on a part other than an area 3 to be a copper circuit pattern and a brazing material protrudent part. When the first masking 2 is not formed, conduction due to the brazing material that is protruding excessively to the space in the copper circuit may occur, and thus the brazing material protrudent part should be etched by hydrofluoric acid or an alkali liquid for removing brazing materials. The present inventors have found out that voids are produced in the brazing material protrudent part by the etching, thereby uniform dispersion of thermal stress that is to be the relaxation of the stress concentration at the end portion of the copper circuit plate is not caused, and cracking of the ceramic substrate and the like easily occurs. By conducting the first masking step, the etching of the brazing material protrudent part becomes unnecessary, thereby pores in the brazing material protrudent part can be decreased and formation of large pores can be prevented.

Figure 2:
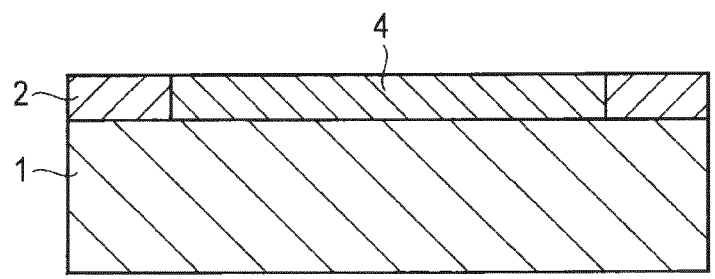
FIG. 2 is a cross-sectional view that schematically shows the steps of applying and printing the brazing material in the second embodiment.

Next, as shown in FIG. 2, a brazing material 4 comprising Ag, Cu and Ti is printed on or applied to the area 3 on which the first masking has not been provided. The area of the brazing material layer 4 to be printed or applied is adjusted to be larger than the shape of the copper circuit plate by a length of protruding. As the method for protruding is not limited to the method comprising printing or applying the brazing material in advance to be larger than the shape of the copper circuit plate by a length of protruding, and for example, a method comprising printing or applying the brazing material in the same shape as the shape of the copper circuit plate and protruding the brazing material by bonding can be adopted. Furthermore, the thickness of the brazing material layer is preferably from 10 to 40 µm. When the thickness is less than 10 µm, a sufficient bonding strength may not be obtained, whereas when it exceeds 40 µm, a further effect cannot be obtained, and the cost may be increased.

Figure 3:
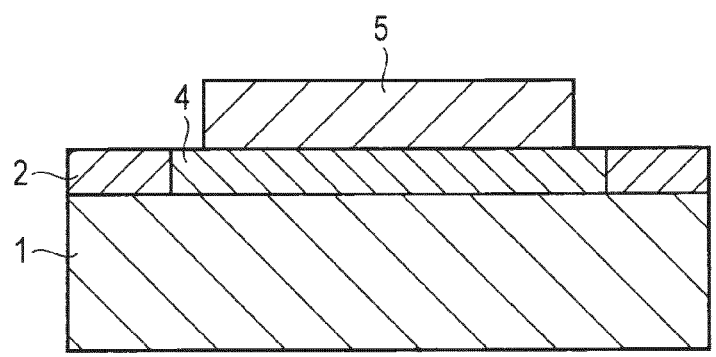
FIG. 3 is a cross-sectional view that schematically shows the step of laminating the copper plate in the second embodiment.

As shown in FIG. 3, a copper plate 5 is mounted on the brazing material layer 4, and the ceramic substrate and the copper plate are bound by heating (an active metal brazing process). As for the conditions for the active metal brazing, an inert atmosphere such as in vacuum and a nitrogen atmosphere, a temperature of from 700 to 900° C., and heating for 10 to 120 minutes are desirable. By this active metal brazing, a Ti phase and a TiN phase are produced in the brazing material layer 4. The degree of production can be adjusted by the composition of the brazing material used, the conditions for the active metal brazing, and the like. When the ceramic substrate is a nitride ceramic substrate (AlN, $Si_3N_4$ and the like), the adjustment is conducted in view of that the TiN phase is formed by a reaction between the Ti in the brazing material and the nitrogen in the nitride ceramic substrate.

It is desirable that markings for position alignment are provided to the ceramic substrate 1 and the copper plate 5. For example, a hole or groove for position alignment can be formed on the ceramic substrate 1 and a protrusion that corresponds to the hole or groove can be provided to the copper plate 5.

Figure 4:
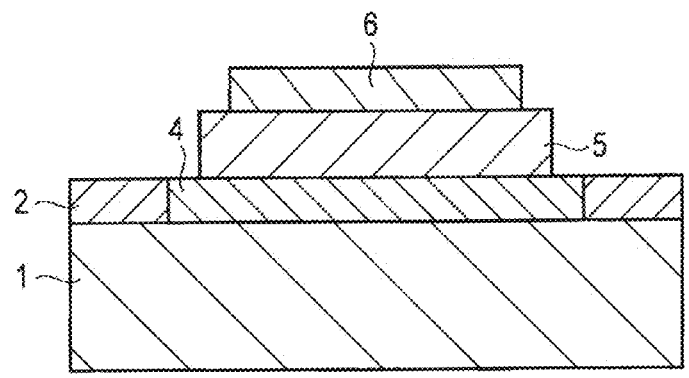
FIG. 4 is a cross-sectional view that schematically shows a second masking step in the second embodiment.
Figure 5:
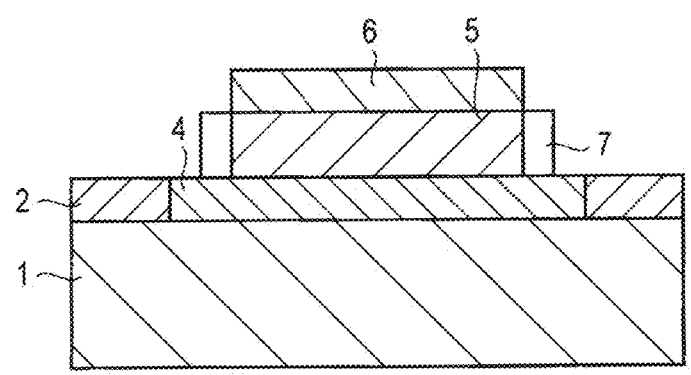
FIG. 5 is a cross-sectional view that schematically shows the step of etching in the second embodiment.

Next, as shown in FIG. 4, a second masking 6 is provided on the copper plate 5 on the area to be a copper circuit pattern. Thereafter, as shown in FIG. 5, a portion 7 on which the second masking 6 has not been formed on the copper plate 5 is removed by etching to form a copper circuit pattern. As an etchant, an etchant for copper plate etching can be used, and specific examples may include ferric chloride, cupric chloride and the like. Since an etchant for copper plate etching is used, when the brazing material protrudent part is exposed excessively to the etchant, the Cu in the brazing material is etched. This phenomenon leads to pores.

Figure 6:
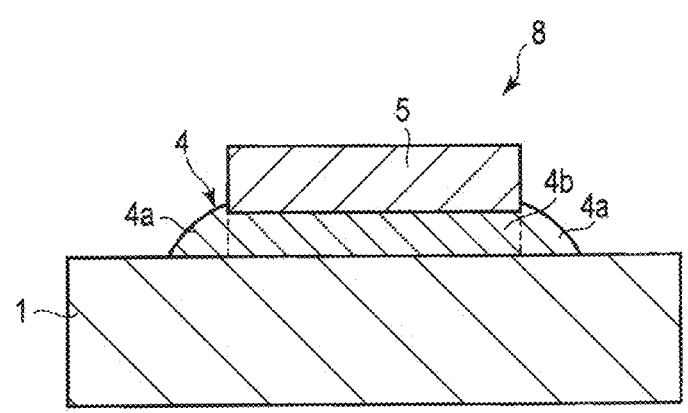
FIG. 6 is a cross-sectional view that schematically shows the ceramic circuit board of the first embodiment.

The first and second maskings 2 and 6 are then removed, thereby the ceramic circuit board 8 of the first embodiment as shown in FIG. 6 can be obtained. The first and second maskings can be formed from a printable organic ink resist or the like.

During the above-mentioned etching, a part of the Cu component in a brazing material layer 4a that protrudes outward from the side surface of the copper circuit pattern 5 (brazing material protrudent part) is removed together, and thus the ratio of the total amount of the Ti phase and TiN phase in the brazing material protrudent part 4a with respect to the entirety of the brazing material protrudent part 4a is increased. On the other hand, the composition of the brazing material layer (bonding layer) 4b that is interposed between the copper circuit pattern 5 and the ceramic substrate 1 is not affected by the etching. Therefore, the total of the Ti phase and TiN phase in the brazing material protrudent part 4a is increased to 3% by mass or more, and is different from the total amount of the Ti phase and TiN phase in the bonding layer 4b. Furthermore, since the etching is for forming the copper circuit pattern, it is not necessary to expose excessively the brazing material protrudent part 4 to the etchant, and thus voids are not produced in the brazing material protrudent part 4a and the number of voids each having an area of 200 $\mu m^2$ or less in the brazing material protrudent part 4a becomes one or less (including zero). Needless to say, voids having an area exceeding 200 $\mu m^2$ are not present.

The total amount of the Ti phase and TiN phase in the brazing material protrudent part 4a can be adjusted by the length of the brazing material protrudent part, conditions for etching, and the like. Furthermore, the number of voids each having an area of 200 $\mu m^2$ or less can be adjusted by conditions for etching, and the like. For example, adjusting the concentration of ferric chloride or cupric chloride in the etchant to be small as 15 wt % or less, and the like may be exemplified. While the lower limit of the concentration of ferric chloride or cupric chloride in the etchant is not specifically limited, it is preferably 5 wt % or more since etching proceeds slowly and the production time becomes longer when the concentration is too small. The shape of the brazing material protrudent part 4a is not limited to have a R-shape in the cross section shown in FIG. 6 and may have a rectangular shape in the cross section.

Furthermore, it is preferable that the end surface of the copper circuit pattern 5 after the etching treatment has a R-shape in the cross section, a sloping shape (a descending slope toward the side of the brazing material layer 4 from the upper surface of the copper circuit pattern 5, for example, a foot shape like the foot of Mt. Fuji). By such shape, the stress at the end surface of the copper circuit plate is relaxed easily.

EXAMPLES

Hereinafter the embodiments will be explained more specifically.

Samples 1 to 9

The respective samples were prepared according to the method explained below. First, first masking was conducted on the surface on which a copper circuit pattern was to be formed, the surface being of a ceramic substrate of 50×60 mm. The first masking was conducted on an area except on an area having a predetermined size to be a copper circuit pattern and a brazing material protrudent part. Next, an Ag—Cu—Ti-based brazing material (Ag: 67% by weight; Cu: 20% by weight; Sn: 10% by weight; Ti: 3% by weight) was printed by a thickness of 15 μm on the area on which the first masking had not been formed and was also printed on the back surface by a thickness of 15 μm, and copper plates were disposed on the both surfaces of the ceramic substrate and bound to the ceramic substrate by heating in vacuum at $10^{-3}$ Pa and 800° C. for 40 minutes. As for the copper circuit plate, two copper plates of 20×20 mm were disposed at a space of 1 mm.

Next, a second masking (etching resist) having a patterned shape was printed on the copper plates, an etching treatment was conducted by using a ferric chloride liquid (concentration of ferric chloride: 5 to 15 wt %) to form a circuit pattern, and the resist was peeled off to give a circuit board. The thicknesses of the AlN substrate used in samples 1 and 2 and $Al_2O_3$ substrate used in samples 3 and 4 were both 0.635 mm, and the thickness of the $Si_3N_4$ substrate used in samples 5 to 9 was 0.32 mm. Furthermore, the AlN substrate used was one having a thermal conduction rate of 170 W/m·K and a three-point bending strength of 450 MPa; the $Al_2O_3$ substrate used was one having a thermal conduction rate of 25 W/m·K and a three-point bending strength of 450 MPa; and the $Si_3N_4$ substrate used was one having a thermal conduction rate of 90 W/m·K and a three-point bending strength of 700 MPa.

The thickness of the copper circuit plate, the kind of the material for the ceramic substrate, the amount of protrusion outward from the side surface of the copper circuit plate (unit:mm, a ratio when the space in the copper circuit is 100%), the total amount of the Ti phase and TiN phase in the bonding layer, the total amount of the Ti phase and TiN phase in the protruded brazing material, and the number of voids each having an area of 200 μm$^2$ or less in the protruded brazing material, are shown in the following Table 1.

Furthermore, defective bonding and deficiency in brazing were examined by visual observation and ultrasonic flaw detection for the obtained ceramic circuit boards, and thermal cycle tests were conducted by using −50° C., 30 minutes→room temperature, 10 minutes→155° C., 30 minutes→room temperature, 10 minutes as one cycle. For the circuit boards after the test, the presence or absence of abnormalities such as peeling of the circuit plates, cracking of the ceramic substrate, and the like, was examined by visual observation and ultrasonic flaw detection. The results by the examination are shown in the following Table 1.

From the results of sample 1 and sample 2 using the AlN substrate, it is understood that samples 1 and 2 in which the total amount of the Ti phase and TiN phase in the protruded brazing material is 3% by mass or more and is different from the total amount of the Ti phase and TiN phase in the bonding layer, and the number of voids each having an area of 200 μm$^2$ or less in the protruded brazing material is one or less, are excellent in thermal cycle resistance.

From the results of sample 3 and sample 4 using the $Al_2O_3$ substrate, it is understood that samples 3 and 4 in which the total amount of the Ti phase and TiN phase in the protruded brazing material is 3% by mass or more and is different from the total amount of the Ti phase and TiN phase in the bonding layer, and the number of voids each having an area of 200 μm$^2$ or less in the protruded brazing material is one or less, are excellent in thermal cycle resistance.

From the results of samples 5 to 9 using the $Si_3N_4$ substrate, it is understood that samples 5 to 9 in which the total amount of the Ti phase and TiN phase in the protruded brazing material is 3% by mass or more and is different from the total amount of the Ti phase and TiN phase in the bonding layer, and the number of voids each having an area of 200 μm$^2$ or less in the protruded brazing material is one or less, are excellent in thermal cycle resistance. In addition, voids each having an area exceeding 200 μm$^2$ were not present in samples 1 to 9. Furthermore, the end surface of the copper circuit plate had an inclined shape (a foot shape) in samples 1 to 9.

Comparative Example 1

An Ag—Cu—Ti-based brazing material that was the same as that used in samples 1 to 9 was applied to the entire surface of a ceramic substrate (AlN substrate) by a thickness of 15 μm, and a copper plate was bonded thereon and thermally bonded. Thereafter, the copper plate was etched with ferric chloride in a patterned form, and the protruded brazing material was further etched using hydrofluoric acid. The amount of protrusion was 0.12 mm that was the same as that in sample 2. The number of voids each having an area of 200 μm$^2$ or less in the protruded brazing material was counted and found to be eight. Furthermore, the same thermal cycle test as that in samples 1 to 9 was conducted, and it was found to be 340 cycles.

Samples 11 to 15

Using an active metal brazing material comprising 63% by weight of Ag, 32% by weight of Cu and 5% by weight of Ti, ceramic circuit boards each having a copper plate and a silicon nitride substrate (plate thickness: 0.32 mm) that had been bonded were produced. The masking and active metal brazing were conducted under the same conditions as those explained in samples 1 to 9.

The thickness of the copper circuit plate, the kind of the material for the ceramic substrate, the amount of protrusion

TABLE 1

| Sample | Thickness of copper circuit board (mm) | Kind of ceramic substrate | Length of brazing material protrudent part (mm) | Ratio of brazing material protrudent part to space in copper circuit plate (%) | Total amount of Ti phase and TiN phase in bonding layer (% by mass) | Total amount of Ti phase and TiN phase in brazing material protrudent part (% by mass) | Number of voids each having area of 200 μm or less in brazing material protrudent part | Thermal resistance cycle (cycles) |
|---|---|---|---|---|---|---|---|---|
| 1 | 0.4 | AlN | 0.01 | 1 | 10 | 16 | 0 | 300 |
| 2 | 0.4 | AlN | 0.12 | 12 | 5 | 35 | 1 | 400 |
| 3 | 0.4 | $Al_2O_3$ | 0.03 | 3 | 7 | 10 | 1 | 300 |
| 4 | 0.4 | $Al_2O_3$ | 0.02 | 2 | 7 | 30 | 0 | 400 |
| 5 | 0.6 | $Si_3N_4$ | 0.05 | 5 | 3 | 5 | 1 | 3000 |
| 6 | 0.6 | $Si_3N_4$ | 0.08 | 8 | 5 | 28 | 0 | 5000 |
| 7 | 0.8 | $Si_3N_4$ | 0.03 | 3 | 5 | 10 | 0 | 2000 |
| 8 | 0.8 | $Si_3N_4$ | 0.01 | 1 | 7 | 20 | 0 | 3000 |
| 9 | 0.8 | $Si_3N_4$ | 0.20 | 20 | 7 | 40 | 1 | 3500 | outward from the side surface of the copper circuit plate (unit:mm, a ratio when the space in the copper circuit is 100%), the total amount of the Ti phase and TiN phase in the bonding layer, the total amount of the Ti phase and TiN phase in the protruded brazing material, and the number of voids each having an area of 200 μm² or less in the protruded brazing material, are shown in the following Table 2.

Furthermore, the numbers of thermal cycle resistance that were measured by conducting the same thermal cycle tests as those explained in samples 1 to 9 are shown in Table 2.

surfaces of the silicon nitride substrate and bound to the silicon nitride substrate by heating in vacuum at $10^{-3}$ Pa and 760 to 810° C. for 20 to 50 minutes. As for the copper circuit plate, two copper plates of 15×20×0.3 mm were disposed at a space of 1 mm. The composition of the Ag—Cu—Ti-based brazing material and the thickness of the brazing material layer were as shown in Table 3. As the silicon nitride ($Si_3N_4$) substrate, one having a thermal conduction rate of 85 W/m·K and a three-point bending strength of 750 MPa was used.

TABLE 2

| Sample | Thickness of copper circuit board (mm) | Kind of ceramic substrate | Length of brazing material protrudent part (mm) | Ratio of brazing material protrudent part to space in copper circuit plate (%) | Total amount of Ti phase and TiN phase in bonding layer (% by mass) | Total amount of Ti phase and TiN phase in brazing material protrudent part (% by mass) | Number of voids each having area of 200 μm or less in brazing material protrudent part | Thermal resistance cycle (cycles) |
|---|---|---|---|---|---|---|---|---|
| 11 | 0.3 | $SI_3N_4$ | 0.03 | 3 | 6 | 29 | 1 | 5000 or more |
| 12 | 0.3 | $SI_3N_4$ | 0.09 | 9 | 10 | 37 | 0 | 5000 or more |
| 13 | 0.5 | $SI_3N_4$ | 0.02 | 2 | 8 | 22 | 0 | 4000 |
| 14 | 0.5 | $SI_3N_4$ | 0.1 | 10 | 10 | 34 | 0 | 5000 or more |
| 15 | 0.5 | $SI_3N_4$ | 0.12 | 12 | 6 | 29 | 0 | 5000 or more |

From the results in Table 2, it is understood that samples 11 to 15 in which the total amount of the Ti phase and TiN phase in the protruded brazing material is 3% by mass or more and is different from the total amount of the Ti phase and TiN phase in the bonding layer, and the number of voids each having an area of 200 μm² or less in the protruded brazing material is one or less, are excellent in thermal cycle resistance, even in the cases when the composition of the active metal brazing material is changed. Furthermore, in the case when silicon nitride was used as a ceramic substrate, no bonding defect was present, no crack was observed between the ceramic substrate and the end portion of the copper circuit plate, and the thermal shock resistance was excellent, even after 3,000 heat cycles. In addition, voids each having an area exceeding 200 μm² were not present in samples 11 to 15. Furthermore, the end surface of the copper circuit plate had an inclined shape (a foot shape) in samples 11 to 15.

Samples 16 to 19

First masking was conducted on the surface on which a copper circuit pattern was to be formed, the surface being of a silicon nitride ($Si_3N_4$) substrate of 40×60×0.32 mm. The first masking was conducted on an area except on an area having a predetermined size to be a copper circuit pattern and a brazing material protrudent part. Next, an Ag—Cu—Ti-based brazing material was printed on the area on which the first masking had not been formed and was also printed on the back surface, and copper plates were disposed on the both Next, a second masking (etching resist) in a patterned form was printed on the copper plate, and an etching treatment was conducted using a cupric chloride liquid (the concentration of cupric chloride: 5 to 15 wt %) to form a circuit pattern, and the resist was peeled off to give a circuit board.

The same measurements as those for sample 1 were conducted for the obtained silicon nitride circuit board. The results are shown in Table 4.

TABLE 3

| Sample | Composition of Ag—Cu—Ti brazing material (wt %) | Thickness of brazing material layer (μm) |
|---|---|---|
| 16 | Ag(68), Cu(25), In(5), Ti(2) | 40 |
| 17 | Ag(60), Cu(25), In(10), Ti(5) | 40 |
| 18 | Ag(68), Cu(29), Ti(3) | 20 |
| 19 | Ag(60), Cu(22), Sn(15), Ti(3) | 10 |

TABLE 4

| Sample | Length of brazing material protrudent part (mm) | Ratio of brazing material protrudent part to space in copper plate (%) | Total amount of Ti phase and TiN phase in bonding layer (% by mass) | Total amount of Ti phase and TiN phase in brazing material protrudent part (% by mass) | Number of voids each having area of 200 μm or less in brazing material protrudent part | Thermal resistance cycle (cycles) |
|---|---|---|---|---|---|---|
| 16 | 0.01 | 1 | 3 | 38 | 0 | 5000 or more |
| 17 | 0.05 | 2 | 6 | 35 | 0 | 5000 or more |
| 18 | 0.10 | 10 | 4 | 18 | 0 | 5000 or more |
| 19 | 0.15 | 15 | 4 | 10 | 0 | 5000 or more |

Figure 7:
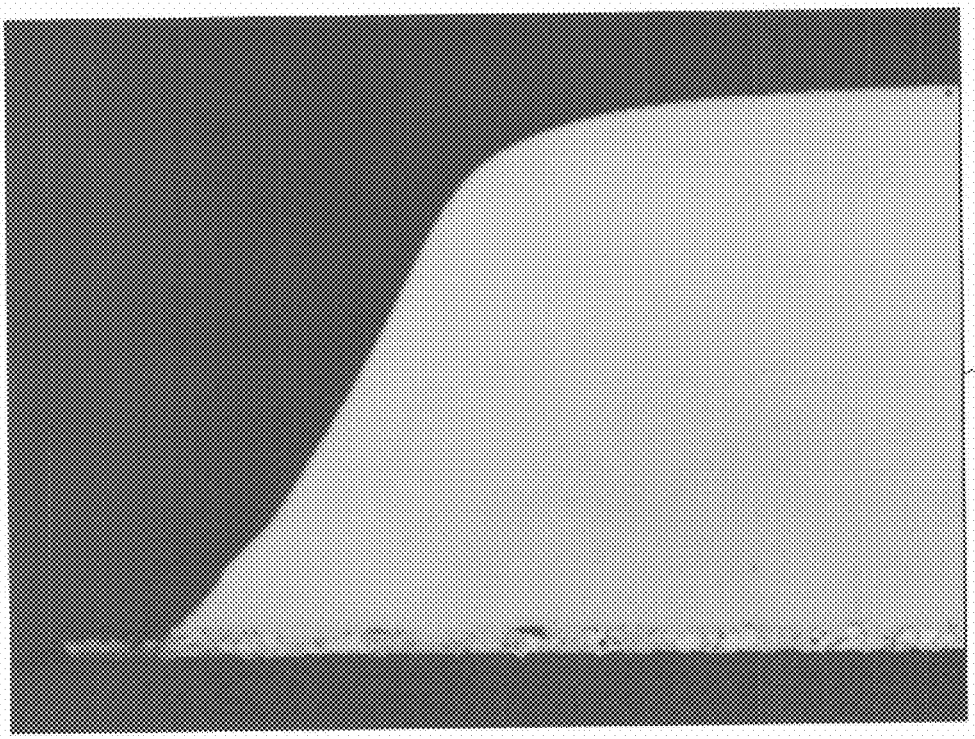
FIG. 7 is an optical micrograph of a cross-sectional surface obtained by cutting a copper circuit plate of a circuit board of sample 17 in a thickness direction.

As understood from Table 3 and Table 4, it was confirmed that excellent properties were shown even if the composition of the brazing material and the thickness of the brazing material layer were changed. Furthermore, since a silicon nitride substrate was used, no bonding defect was present, no crack was observed between the silicon nitride substrate and the end portion of the copper circuit plate, and the thermal shock resistance was excellent, even after 5,000 heat cycles. In addition, voids each having an area exceeding 200 μm² were not present in samples 1 6 to 19. Furthermore, as shown in the optical micrograph of the cross-sectional surface in the thickness direction of the copper circuit plate 5 in FIG. 7, the copper circuit plate 5 had an end surface having an inclined shape (a foot shape). The same shape was also observed in other samples.

As explained above, according to the embodiments and Examples, a ceramic circuit board having high reliability can be formed, which is significantly effective in industries.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A ceramic circuit board, comprising:
a ceramic substrate;
a copper circuit plate bonded to at least one surface of the ceramic substrate through a brazing material layer comprising Ag, Cu, and Ti; and
a brazing material protrudent part formed by the brazing material layer which protrudes outside from a side surface of the copper circuit plate;
wherein the brazing material protrudent part comprises a Ti phase and a TiN phase of 3% by mass or more in total, which is different from the total amount of a Ti phase and a TiN phase in the brazing material layer that is interposed between the ceramic substrate and the copper circuit plate, and a number of voids each having an area of 200 μm² or less in the brazing material protrudent part is one or less (including zero).

2. The ceramic circuit board according to claim 1, wherein the brazing material protrudent part comprises the Ti phase and TiN phase of from 3% by mass to 40% by mass in total.

3. The ceramic circuit board according to claim 1, wherein the brazing material protrudent part has a protrudent length that is 0.01 mm or more.

4. The ceramic circuit board according to claim 1, wherein the ceramic substrate is composed of silicon nitride, aluminum nitride, or alumina, and the copper circuit plate has a thickness of 0.25 mm or more.

5. The ceramic circuit board according to claim 1, wherein the brazing material layer is formed using a brazing material having a composition consisting of Ag: 90 to 50% by weight, Sn and/or In: 5 to 15% by weight, Ti: 0.1 to 6% by weight, and a remnant Cu and unavoidable impurities.

6. A ceramic circuit board, comprising:
a ceramic substrate;
a copper circuit plate;
a brazing material layer including Ag, Cu, and Ti disposed between the ceramic substrate and the copper circuit plate to bond the copper circuit plate to the ceramic substrate; and
a brazing material protrudent part formed by the brazing material layer that protrudes out from between the ceramic substrate and the copper circuit plate, and from outside of a side surface of the copper circuit plate;
wherein the brazing material protrudent part has a Ti phase and a TiN phase of 3% by mass or more in total, which is different from a total amount of a Ti phase and a TiN phase in the brazing material layer interposed between the ceramic substrate and the copper circuit plate;
wherein the brazing material protrudent part includes no more than one void having an area of 200 μm² or less; and
wherein the ceramic circuit board has both a high thermal cycle resistance and a high thermal shock resistance.

7. The ceramic circuit board of claim 6, wherein the brazing material protrudent part is subject to only a single etchant.

8. The ceramic circuit board of claim 7, wherein the brazing material protrudent part is etched with a copper plate etchant.

9. The ceramic circuit board of claim 6, wherein the brazing material protrudent part is etched with a copper plate etchant.

10. The ceramic circuit board of claim 6, wherein the brazing material protrudent part is etched with a copper plate etchant including ferric chloride or cupric chloride.

11. The ceramic circuit board of claim 6, wherein the brazing material protrudent part is etched with a copper plate etchant including ferric chloride or cupric chloride of no greater than 15 wt %.

12. The ceramic circuit board of claim 6, wherein the brazing material is not subject to a brazing material etchant.

13. The ceramic circuit board of claim 6, wherein the brazing material protrudent part is without voids having an area of greater than 200 μm².

14. The ceramic circuit board of claim 6, wherein the brazing material protrudent part includes a plurality of pores etched therein with a copper plate etchant.

15. A ceramic circuit board, comprising:
a ceramic substrate;
a copper circuit plate;
a brazing material layer including Ag, Cu, and Ti disposed between the ceramic substrate and the copper circuit plate to bond the copper circuit plate to the ceramic substrate; and
a brazing material protrudent part of the brazing material layer that protrudes out from between the ceramic substrate and the copper circuit plate, and from outside of a side surface of the copper circuit plate;
wherein the brazing material protrudent part has a Ti phase and a TiN phase of 3% by mass or more in total, which is different from a total amount of a Ti phase and a TiN phase in the brazing material layer interposed between the ceramic substrate and the copper circuit plate;
wherein the brazing material protrudent part is etched with a copper plate etchant including 15 wt % of ferric chloride or cupric chloride such that the brazing material protrudent part includes no more than one void having an area of 200 μm² or less and no voids having an area greater than 200 μm²; and
wherein the ceramic circuit board has both a high thermal cycle resistance and a high thermal shock resistance.

16. The ceramic circuit board of claim 15, wherein the brazing material protrudent part is subject to only a single etchant.

17. The ceramic circuit board of claim 15, wherein the brazing material is not subject to a brazing material etchant.

18. The ceramic circuit board of claim 15, wherein the brazing material protrudent part includes a plurality of pores etched therein with the copper plate etchant.

19. The ceramic circuit board of claim 15, wherein the brazing material protrudent part includes the Ti phase and the TiN phase from 3% by mass to 40% by mass in total.

20. The ceramic circuit board of claim 15, wherein the brazing material protrudent part has a protrudent length that is 0.01 mm or more and is 30% or less of a space in the copper circuit plate.

* * * * *